(12) United States Patent
Shem et al.

(10) Patent No.: US 9,866,778 B2
(45) Date of Patent: Jan. 9, 2018

(54) PREDICTIVE SIGMA-DELTA ADC FILTER FOR POWER CONSUMPTION

(71) Applicant: Sony Semiconductor Solutions Corporation, Kanagawa (JP)

(72) Inventors: Ariel Ben Shem, Hasharon (IL); Itai Shvartz, Petach-Tikva (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 265 days.

(21) Appl. No.: 14/928,486

(22) Filed: Oct. 30, 2015

(65) Prior Publication Data

US 2017/0126245 A1   May 4, 2017

(51) Int. Cl.
*H04N 5/378*   (2011.01)
*H04N 5/369*   (2011.01)
*H03M 3/00*   (2006.01)

(52) U.S. Cl.
CPC .............. *H04N 5/378* (2013.01); *H03M 3/32* (2013.01); *H03M 3/496* (2013.01); *H04N 5/3698* (2013.01)

(58) Field of Classification Search
CPC ........ H03M 3/32; H03M 3/496; H03M 3/458; H03M 3/464; H03M 3/494; H01L 27/14609; H04N 5/378; H04N 5/3698; H04N 5/3745; H04N 5/37455
See application file for complete search history.

(56) References Cited

U.S. PATENT DOCUMENTS

| | | | | |
|---|---|---|---|---|
| 5,142,286 | A * | 8/1992 | Ribner | H03M 3/344 341/143 |
| 8,421,660 | B1 * | 4/2013 | Wan | H03M 3/392 341/118 |
| 9,344,660 | B2 * | 5/2016 | Petilli | H04N 5/378 |
| 2002/0083109 | A1 * | 6/2002 | Willson, Jr. | H04L 25/03834 708/700 |
| 2012/0161750 | A1 * | 6/2012 | Moon | G01R 21/133 324/116 |

\* cited by examiner

*Primary Examiner* — Que T Le
*Assistant Examiner* — Jennifer Bennett
(74) *Attorney, Agent, or Firm* — Michael Best & Friedrich LLP (57) ABSTRACT

A sigma-delta analog-to-digital converter comprises a sigma-delta modulator; and an ADC filter that receives a segment of L binary samples from the sigma-delta modulator, L being a positive integer. The ADC filter includes a predictor circuit that determines whether a power consumption of a first summing method would be higher than a power consumption of a second summing method, based on a content of the segment, and an accumulator circuit that calculates an output using the first summing method in a case where the power consumption of the first summing method would be lower than the power consumption of the second summing method, and using the second summing method in a case where the power consumption of the first summing method would be higher than the power consumption of the second summing method.

20 Claims, 12 Drawing Sheets

| Next Input Bits | Pre-Computed Partial Sums | Action |
| --- | --- | --- |
| 0 | none | Skip |
| 11 | $h_k + h_{k-1}$ | Add Pre-Computed Partial Sum to Accumulator |
| 101 | $h_k + h_{k-2}$ | Add Pre-Computed Partial Sum to Accumulator |
| 1001 | $h_k + h_{k-3}$ | Add Pre-Computed Partial Sum to Accumulator |
| 1000 | $h_{k-3}$ | Add Pre-Computed Partial Sum to Accumulator |

PREDICTIVE SIGMA-DELTA ADC FILTER FOR POWER CONSUMPTION

BACKGROUND OF THE INVENTION

1. Field of the Invention

This application relates generally to analog-to-digital conversion. More specifically, this application relates to a system and method for calculating an output from a sigma-delta analog-to-digital converter that minimizes power consumption.

2. Description of Related Art

Image sensing devices typically consist of an image sensor, generally an array of pixel circuits, as well as signal processing circuitry and any associated control or timing circuitry. Within the image sensor itself, charge is collected in a photoelectric conversion device of the pixel circuit as a result of the impingement of light.

Figure 1:
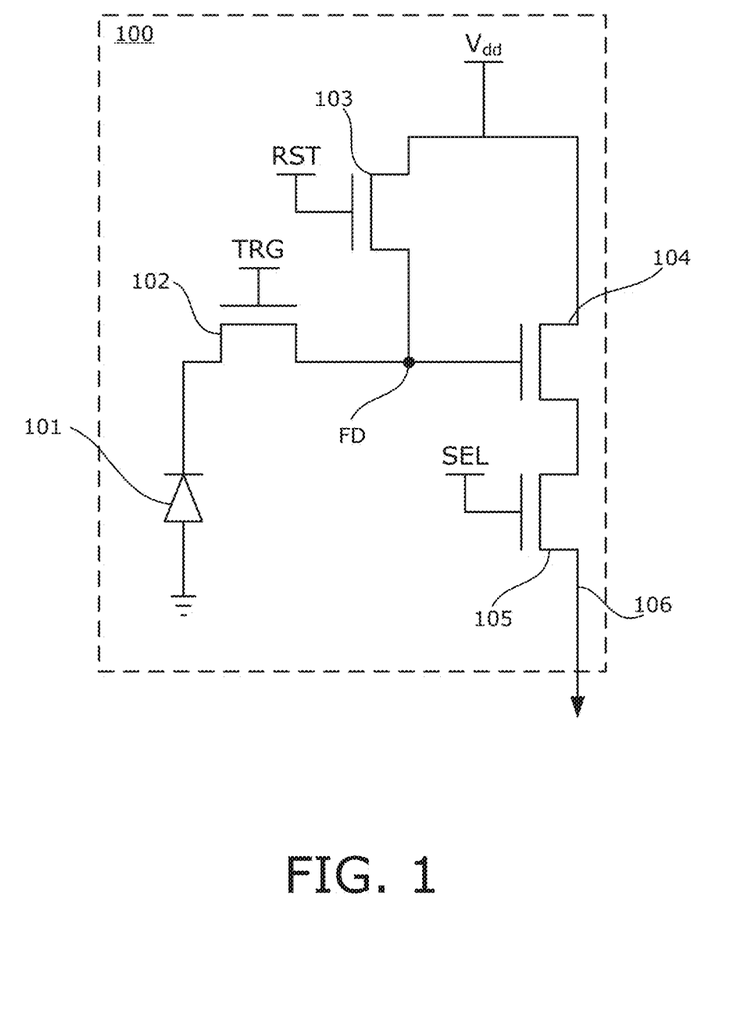
FIG. 1 illustrates an exemplary pixel circuit for use with various aspects of the present disclosure.

One example of a pixel circuit is illustrated in FIG. 1. As shown in FIG. 1, a pixel circuit 100 includes a photoelectric conversion device 101 (e.g., a photodiode), a floating diffusion FD, a transfer transistor 102, a reset transistor 103, a source follower transistor 104, and a selection transistor 105, and a vertical signal line 106. As illustrated, vertical signal line 106 is common to a plurality of pixel circuits within the same column. Alternatively, a vertical signal line may be shared among multiple columns. Gate electrodes of transfer transistor 102, reset transistor 103, and selection transistor 105 receive signals TRG, RST, and SEL, respectively. These signals may, for example, be provided by the control or timing circuitry. Light falling on photoelectric conversion device 101 is converted into an analog electrical signal.

While FIG. 1 illustrates a pixel circuit having four transistors in a particular configuration, the current disclosure is not so limited and may apply to a pixel circuit having fewer or more transistors as well as other elements, such as capacitors, resistors, and the like. Additionally, the current disclosure may be extended to configurations where one or more transistors are shared among multiple photoelectric conversion devices.

The analog electrical signal in photoelectric conversion device 101 is retrieved by a readout circuit and is then converted to a digital value. Such a conversion typically requires several circuit components such as sample-and-hold (S/H) circuits, analog-to-digital converters (ADC), and timing and control circuits, with each circuit component serving a purpose in the conversion. For example, the purpose of the S/H circuit may be to sample the analog signals from different time phases of the photodiode operation, after which the analog signals may be converted to digital form by the ADC.

In an image sensor, there are typically a very large number of individual photoelectric conversion devices (e.g. tens of millions), and many ADCs working in parallel. Each ADC in the image sensor is shared by a large number of photoelectric conversion devices; for example, a column or multiple columns of photoelectric conversion devices may share a single ADC, a rectangular block of photoelectric conversion devices may share an ADC, and the like. As the number of pixels in the image sensor increases, the number of ADCs also increases. As a result, the power consumption of the ADCS becomes an increasingly large factor as the image resolution (i.e., number of pixels) increases. As the total power consumption in an image sensor in a mobile device increases, not only is there an increase in the power drawn from a battery and resultant decrease in operating time of the mobile device, but there is also an increase in the temperature of the silicon and resultant degradation in the noise performance of the sensor. Accordingly, there exists a need to improve the power consumption characteristics of an image sensor that uses sigma-delta ADCs.

BRIEF SUMMARY OF THE INVENTION

Various aspects of the present disclosure relate to a sigma-delta ADC having improved power consumption characteristics.

In one aspect of the present disclosure, a sigma-delta analog-to-digital converter, comprises a sigma-delta modulator; and an ADC filter configured to receive a segment of L binary samples from the sigma-delta modulator, L being a positive integer, including a predictor circuit configured to determine whether a power consumption of a first summing method would be higher than a power consumption of a second summing method, based on a content of the segment, and an accumulator circuit configured to calculate an output using the first summing method in a case where the power consumption of the first summing method would be lower than the power consumption of the second summing method, and using the second summing method in a case where the power consumption of the first summing method would be higher than the power consumption of the second summing method.

In another aspect of the present disclosure, method of calculating an output in a sigma-delta analog-to-digital converter, comprises receiving, at an ADC filter of the sigma-delta analog-to-digital converter, a segment of L binary samples from a sigma-delta modulator of the sigma-delta analog-to-digital converter; predicting, at a predictor circuit of the ADC filter, whether a power consumption of a first summing method would be higher than a power consumption of a second summing method, based on a content of the segment; calculating the output using the first summing method in an accumulator circuit of the ADC filter, in a case where the power consumption of the first summing method would be lower than a power consumption of the second summing method; and calculating the output using the second summing method in an accumulator circuit of the ADC filter, in a case where the power consumption of the first summing method would be higher than a power consumption of the second summing method.

In yet another exemplary aspect of the present disclosure, an image sensor comprises a pixel array; and a sigma-delta analog-to-digital converter including a sigma-delta modulato; and an ADC filter configured to receive a segment of L binary samples from the sigma-delta modulator, L being a positive integer, the ADC filter having a predictor circuit configured to determine whether a power consumption of a first summing method would be higher than a power consumption of a second summing method, based on a content of the segment, and an accumulator circuit configured to calculate an output using the first summing method in a case where the power consumption of the first summing method would be lower than the power consumption of the second summing method, and using the second summing method in a case where the power consumption of the first summing method would be higher than the power consumption of the second summing method.

In this manner, the above aspects of the present disclosure provide for improvements in at least the technical field of analog-to-digital conversion, as well as the related technical fields of imaging, image processing, and the like.

This disclosure can be embodied in various forms, including hardware or circuits controlled by computer-implemented methods, computer program products, computer systems and networks, user interfaces, and application programming interfaces; as well as hardware-implemented methods, signal processing circuits, image sensor circuits, application specific integrated circuits, field programmable gate arrays, and the like. The foregoing summary is intended solely to give a general idea of various aspects of the present disclosure, and does not limit the scope of the disclosure in any way.

DESCRIPTION OF THE DRAWINGS

These and other more detailed and specific features of various embodiments are more fully disclosed in the following description, reference being had to the accompanying drawings, in which.

DETAILED DESCRIPTION

In the following description, numerous details are set forth, such as flowcharts, data tables, and system configurations. It will be readily apparent to one skilled in the art that these specific details are merely exemplary and not intended to limit the scope of this application.

Moreover, while the present disclosure focuses mainly on examples in which the ADCs are used in image sensors, it will be understood that this is merely one example of an implementation. It will further be understood that the disclosed ADC circuits can be used in any device in which there is a need to convert a signal from analog to digital; for example, an audio signal processing circuit, industrial measurement and systems, and the like.

[Sigma-Delta ADC]

Figure 2:
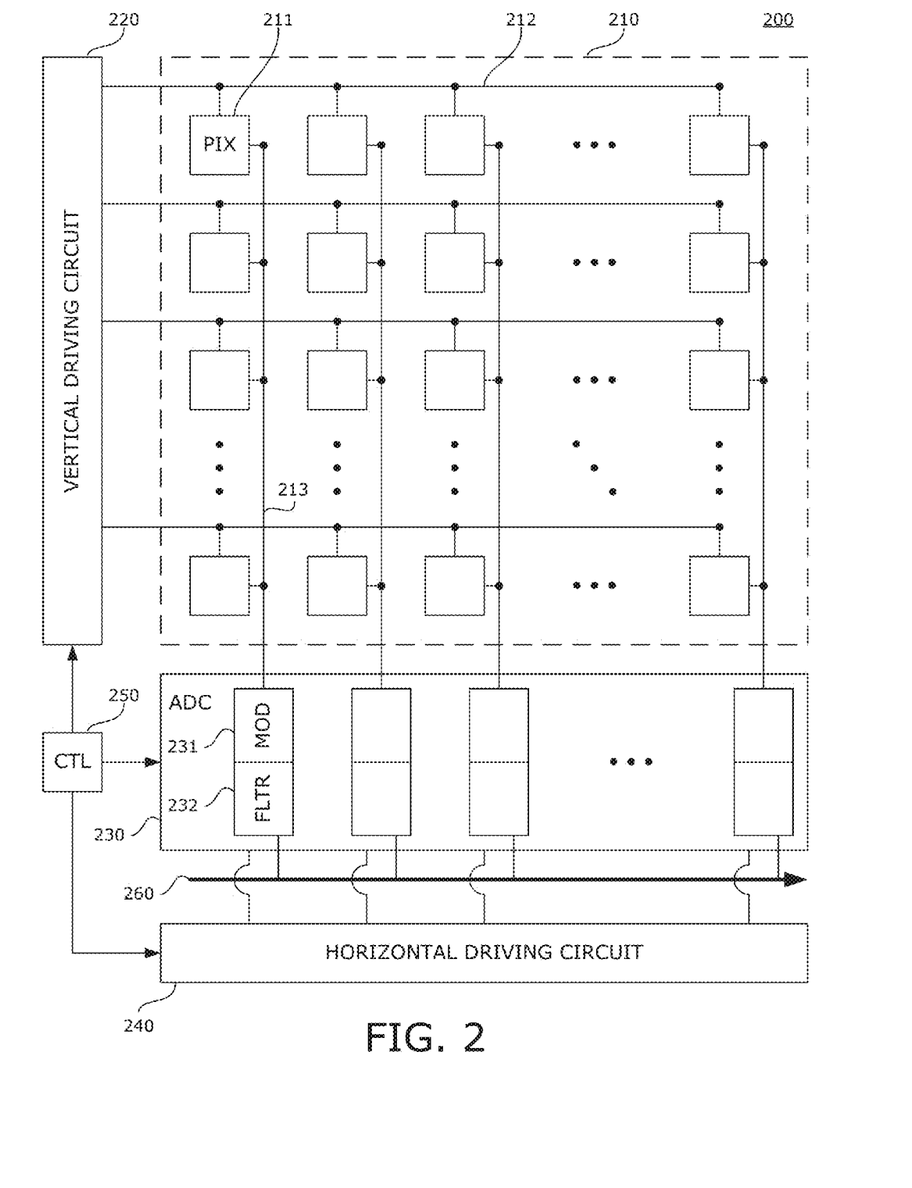
FIG. 2 illustrates an exemplary image sensor according to various aspects of the present disclosure.

In an image sensor application, a sigma-delta ADC may be used to achieve a compact design with good performance. FIG. 2 illustrates an image sensor 200 that uses sigma-delta ADCs. Image sensor includes an array 210 of pixels 211 (for example, pixels as illustrated in FIG. 1). Pixels 211 are located at intersections where horizontal signal lines 212 and vertical signal lines 213 cross one another. Horizontal signal lines 212 are operatively connected to a vertical driving circuit 220, also known as a "row scanning circuit," at a point outside of the pixel array, and carry signals from vertical driving circuit 220 to a particular row of pixels 211. Pixels in a particular column output an analog signal corresponding to an amount of incident light to vertical signal line 213. For illustration purposes, only a small number of pixels 211 are actually shown in FIG. 2; however, in practice image sensor 200 may have up to tens of millions of pixels ("megapixels" or MP) or more.

Vertical signal line 213 conducts the analog signal for a particular column to a column circuit 230. While FIG. 2 illustrates one vertical signal line 213 for each column in pixel array 210, the present disclosure is not so limited. For example, more than one vertical signal line 213 may be provided for each column, or each vertical signal line 213 may correspond to more than on column. In any case, column circuit 230 preferably includes a plurality of sigma-delta ADCs. As illustrated, the sigma-delta ADC includes a sigma-delta modulator 231 and an ADC filter (ADCF) 232, also known as a decoder filter. As illustrated, the ADC circuit includes a modulator 231 and a filter 232 for each vertical signal line 213; however, each modulator/filter may correspond to more than one vertical signal line 213. Other possible circuit components of column circuit 230, such as S/H circuits, voltage-to-current (V2I) circuits, counters, and the like, are omitted from the illustration of FIG. 2 for clarity purposes.

Column circuit 230 is controlled by a horizontal driving circuit 240, also known as a "column scanning circuit." Each of vertical driving circuit 220, column circuit 230, and horizontal driving circuit 240 receive one or more clock signals from a controller 250. Controller 250 controls the timing and operation of various image sensor components such that analog signals from pixel array 210, having been converted to digital signals in column circuit 230, are output via output circuit 260 for signal processing, storage, transmission, and the like.

Figure 3:
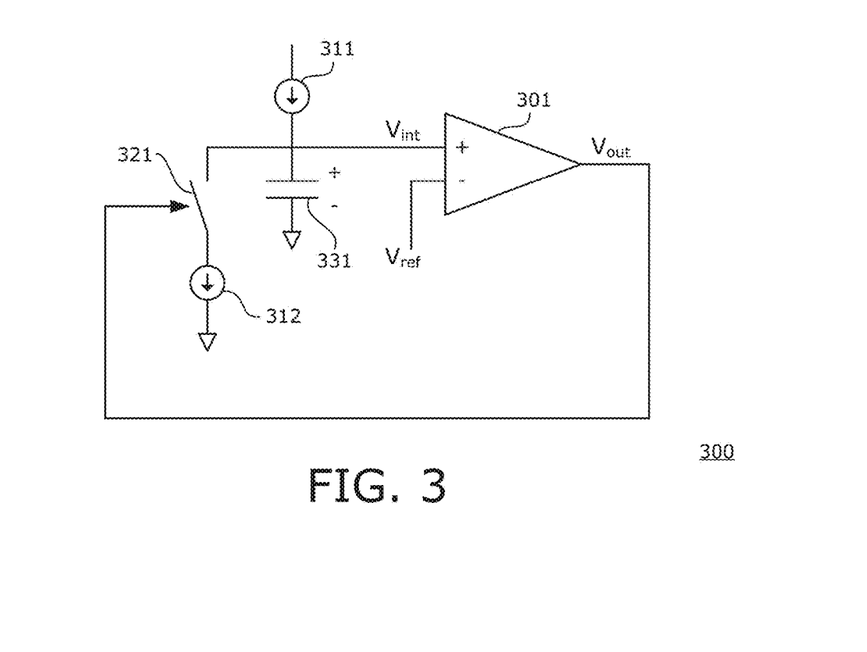
FIG. 3 illustrates an exemplary first-order current mode sigma-delta modulator according to various aspects of the present disclosure.

FIG. 3 illustrates a first order current-mode sigma-delta modulator 300, which may be an example of sigma-delta modulator 231 illustrated in FIG. 2. Modulator 300 receives the input analog signal as an input current $I_{in}$ (represented as current source 311) and uses a feedback circuit to convert the analog signal into a binary sequence $V_{out}$ under the control of a clock.

Modulator 300 further includes a clocked comparator quantizer 301, a reference current source 312 that outputs a current $I_{ref}$, a switch 321, and an integrating capacitor 331. Comparator 301 is configured to compare a voltage $V_{int}$ on capacitor 331 with a reference voltage $V_{ref}$, and to output voltage $V_{out}$ as a comparison result. Switch 321 is configured such that when an output of comparator 301 is at a high level, switch 321 is closed. Conversely, when the output of comparator 301 is at a low level, switch 321 is opened. To achieve this, switch 321 may preferably be a transistor, such as a MOS transistor.

While FIG. 3 illustrates a first order current mode sigma-delta modulator, high order sigma-delta modulators (e.g. second or third order) may be used. Additionally, a voltage mode sigma-delta modulator, which receives an analog voltage as an input instead of an analog current, may be used without departing from the present disclosure. In any event, the output of modulator 300 is output to an ADCF, which digitally filters the binary sequence $V_{out}$ and down-samples the output to the desired multi-bit digital signal. Specifically, the ADCF calculates a weighted average of the binary signal using weights given by the impulse response of a filter.

[Summing Up/Down]

Figure 4:
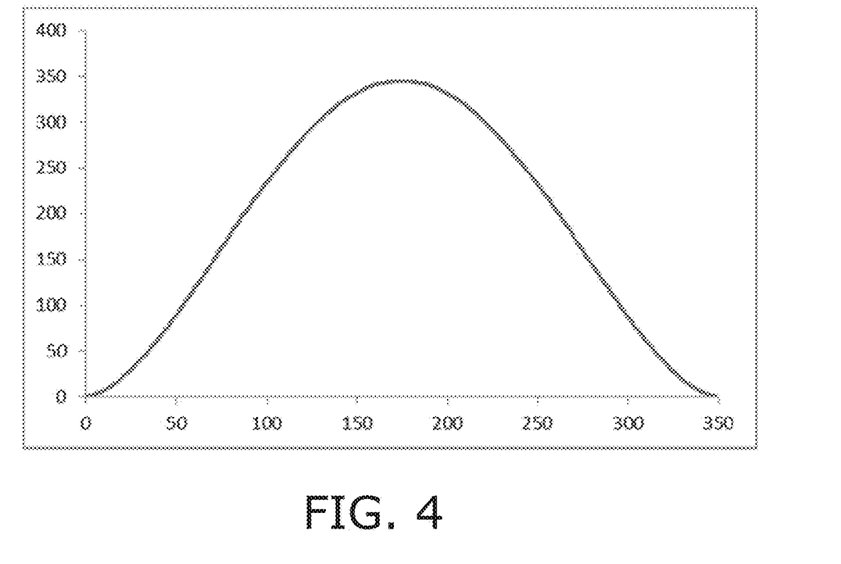
FIG. 4 illustrates an exemplary impulse response of an ADC filter according to various aspects of the present disclosure.

FIG. 4 illustrates an example of an impulse response of an ADCF where the length of the impulse response is 350. As illustrated, every impulse response term has a positive value; however, an impulse response with both positive and negative terms may also be used. For a given impulse response, the output of the ADCF can be calculated according to the following expression (1):

$$y_n = y_{mL} = \sum_{k=0}^{L-1} h_k x_{mL-k} \quad (1)$$

Above, L represents the length of the ADCF impulse response, $h_k$ represents the impulse response, $x_n$ represents the input to the ADCF (i.e., the output binary sequence of the sigma-delta modulator), and $y_n$ is the output of the ADCF (i.e., the multi-bit output samples). As illustrated in FIG. 4, L=350. This calculation may be formed once for each segment of L binary samples from the sigma-delta modulator. After the output is computed, $y_n$ (where n=m×L) represents a down-sample sequence which comprises multi-bit sample values.

Figure 5:
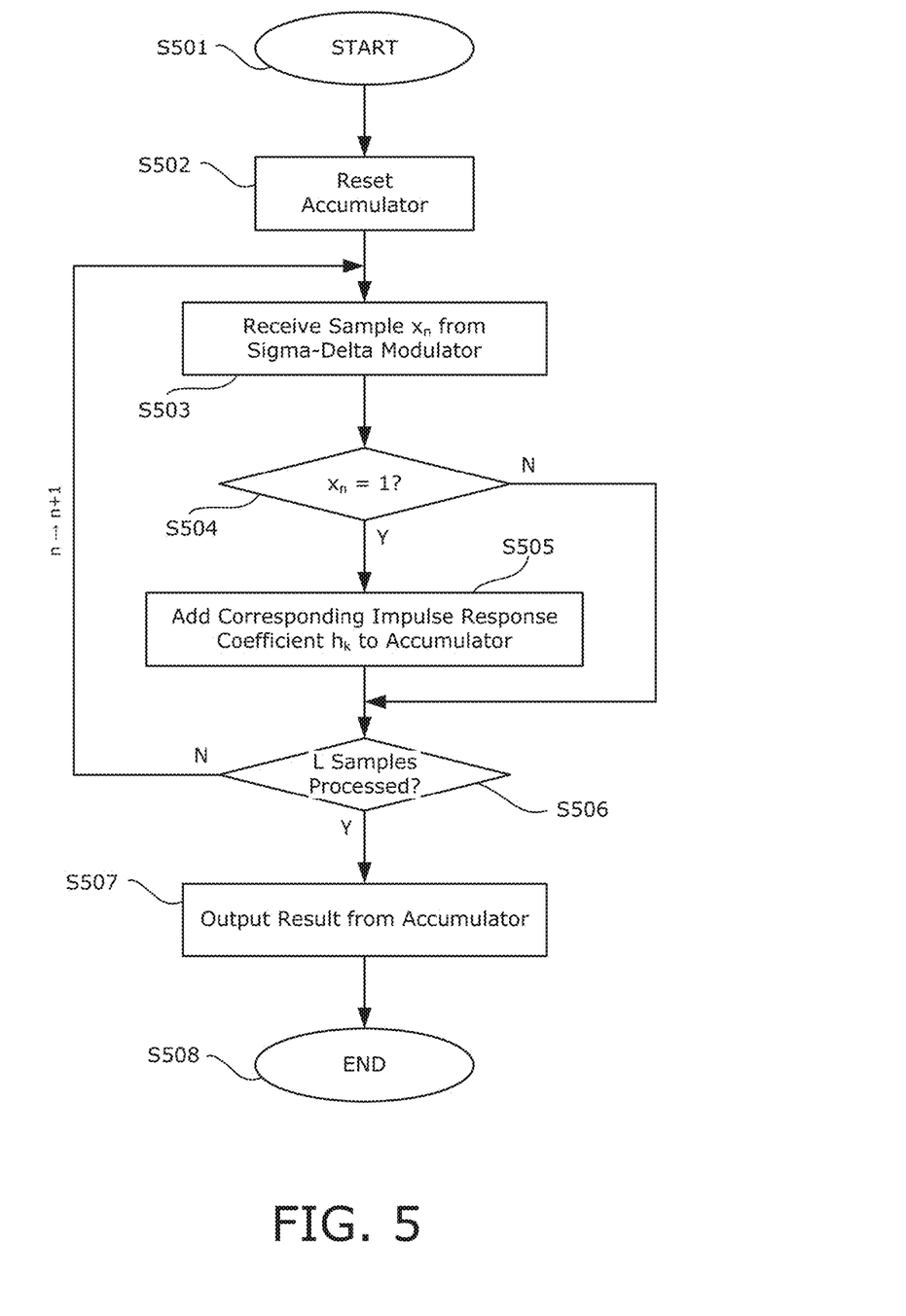
FIG. 5 illustrates an exemplary process flow for a summing up method of calculating the output in an ADC filter according to various aspects of the present disclosure.

Because $x_n$ is either 0 or 1 for any n, the calculation of $y_n$ is equivalent to summing the impulse response values $h_k$ which correspond to the 1s in the binary sequence $x_n$. FIG. 5 illustrates an exemplary process flow for this procedure, which is referred to as a "summing up" method. This method begins at step S501, and proceeds to step S502 where the accumulator that holds the convolution sum is reset to zero. As the binary input samples from the sigma-delta modulator arrive, they are processed one at a time. First, in step S503, a sample $x_n$ is received from the sigma-delta modulator. Next, at step S504, the value of the sample $x_n$ is determined. If $x_n$=1, the corresponding impulse response sample $h_k$ is added to the convolution sum in the accumulator at step S505. If $x_n$=0, step S505 is skipped. Finally, at step S506, it is determined whether all L samples have been processed. If not, the method returns to step S503 to examine the next sample $x_{+1}$. If all L samples have been processed, the convolution sum in the accumulator corresponds to the multi-bit output value from the ADCF. This value is then output in step S507, and the method terminates at step S508. At this point, an output sample from the sigma-delta ADC is calculated. The process in FIG. 5 is repeated to calculate additional output samples, one at a time.

This method is referred to as a "summing up" method because the sum, which comprises a maximum of L terms, starts initially from zero and gradually includes more and more terms as the binary sequence is observed. For the particular impulse response illustrated in FIG. 4, the value of the sum gradually increases as more and more terms are included since the impulse response coefficients are all positive. For impulse responses having both positive and negative coefficients, the sum follows an increasing trend, although not in a monotonic fashion.

Figure 6:
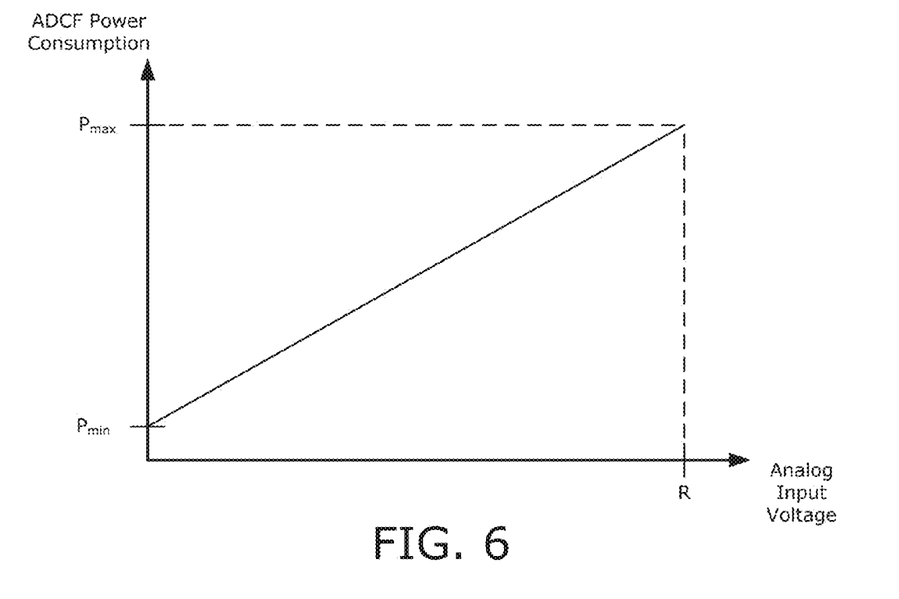
FIG. 6 illustrates an exemplary relationship between power consumption and input analog voltage level in a summing up method according to various aspects of the present disclosure.

When the ADCF is implemented in hardware, the power consumption of the ADCF increases linearly with the number of additions required to compute $y_n$. Because in the binary sequence generated by the sigma-delta modulator the number of 1s in the sequence is proportional to the analog input value, and because step S505 is performed for each 1 in the sequence but not for any 0 in the sequence, the number of additions required to compute $y_n$ (and thus the power consumption) increases as the analog input value increases. FIG. 6 illustrates the relationship between the power consumption and the analog voltage level in an ADCF implementation. As illustrated in FIG. 6, the circuit is designed to operate within an analog voltage range of 0 to R volts. When the input voltage is at the lowest level 0, the sequence $x_n$ is entirely composed of 0s. At this level, the power consumption of the ADCF is a minimum value $P_{min}$. When the input voltage is at the highest level R, the sequence $x_n$ is entirely composed of 1s. At this level, the power consumption of the ADCF is a maximum value $P_{max}$. For input voltages between 0 and R, the binary sequence $x_n$ is composed of both 0s and 1s where the proportion of 1s corresponds to the input voltage. Thus, as the input voltage level increases, the power consumption increases as a result of the number of additions necessary to perform the summing up method.

Alternatively, the output of the ADCF can be calculated according to the following expression (2):

$$y_n = y_{mL} = C - \sum_{k=0}^{L-1} h_k \bar{x}_{mL-k} \quad (2)$$

$$\text{where } C = \sum_{k=0}^{L-1} h_k$$

Above, $\bar{x}_n$ represents binary inverse of $x_n$, the input to the ADCF. For any given impulse response, C is a constant and thus can be computed ahead of time and stored. Generally, the sum of all coefficients gives the highest value in binary representation given to the number of bits that are used. For example, for 12-bit accuracy, the sum of the filter coefficients will be $2^{12}-1=4095$ (or 1111 1111 1111 in binary representation).

Figure 7:
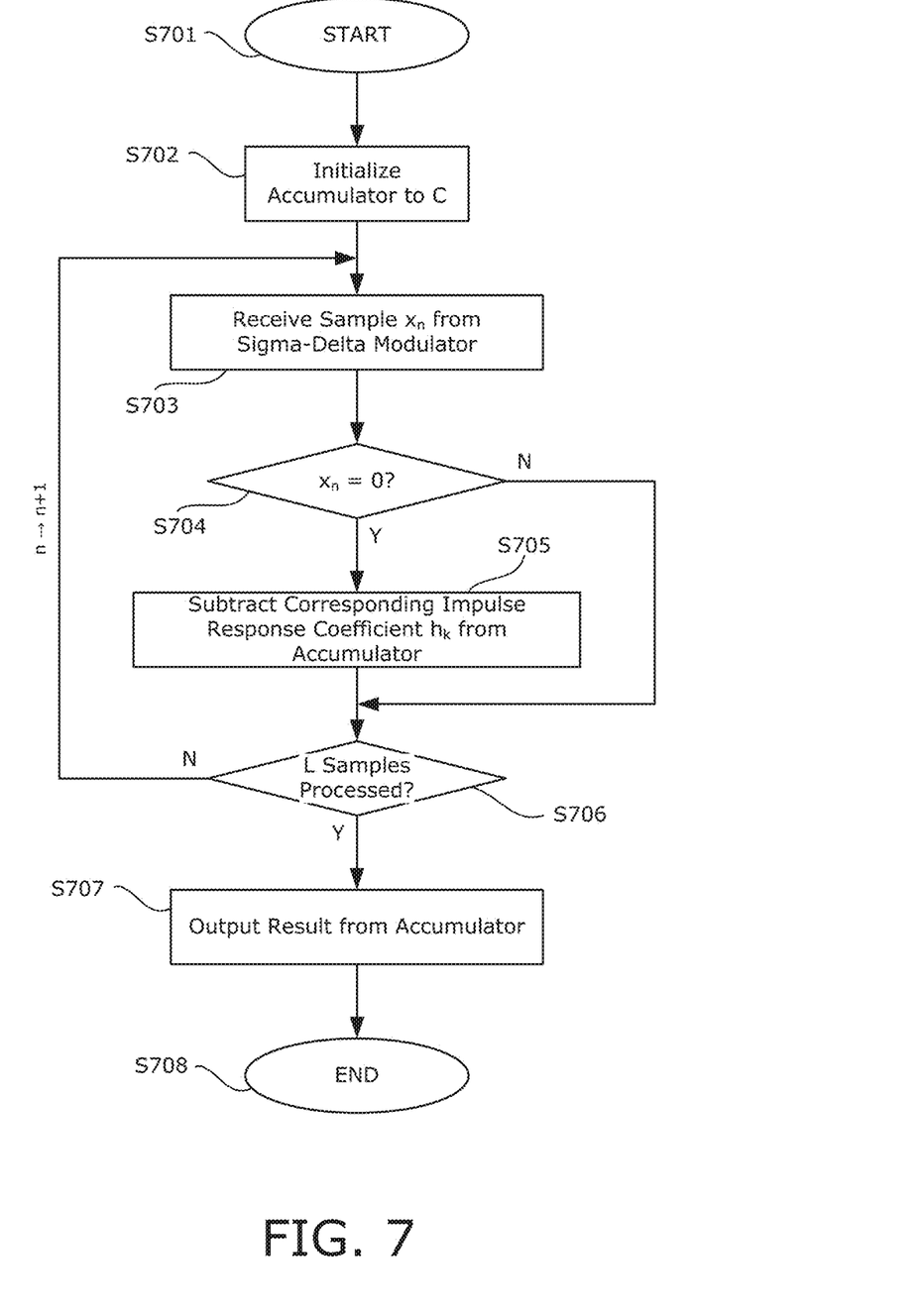
FIG. 7 illustrates an exemplary process flow for a summing down method of calculating the output in an ADC filter according to various aspects of the present disclosure.

FIG. 7 illustrates an exemplary process flow, which is referred to as a "summing down" method. This method begins at step S701, and proceeds to step S702 where the accumulator that holds the convolution sum is initialized to the value C. As the binary input samples from the sigma-delta modulator arrive, they are processed one at a time. First, in step S703, a sample $x_n$ is received from the sigma-delta modulator. Next, at step S704, the value of the sample $x_n$ is determined. If $x_n$=0 (i.e. if $\bar{x}_n$=1), the corresponding impulse response sample $h_k$ is subtracted from the convolution sum in the accumulator at step S705. If $x_n$=1, step S705 is skipped. Finally, at step S706, it is determined whether all L samples have been processed. If not, the method returns to step S703 to examine the next sample $x_{n+1}$. If all L samples have been processed, the convolution sum in the accumulator corresponds to the multi-bit output value from the ADCF. This value is then output in step S707, and the method terminates at step S708. At this point, an output sample from the sigma-delta ADC is calculated. The process in FIG. 7 is repeated to calculate additional output samples, one at a time. This method is referred to as a "summing down" method because, when additional terms are included, the corresponding impulse response coefficient $h_k$ is subtracted from the partial sum.

Figure 8:
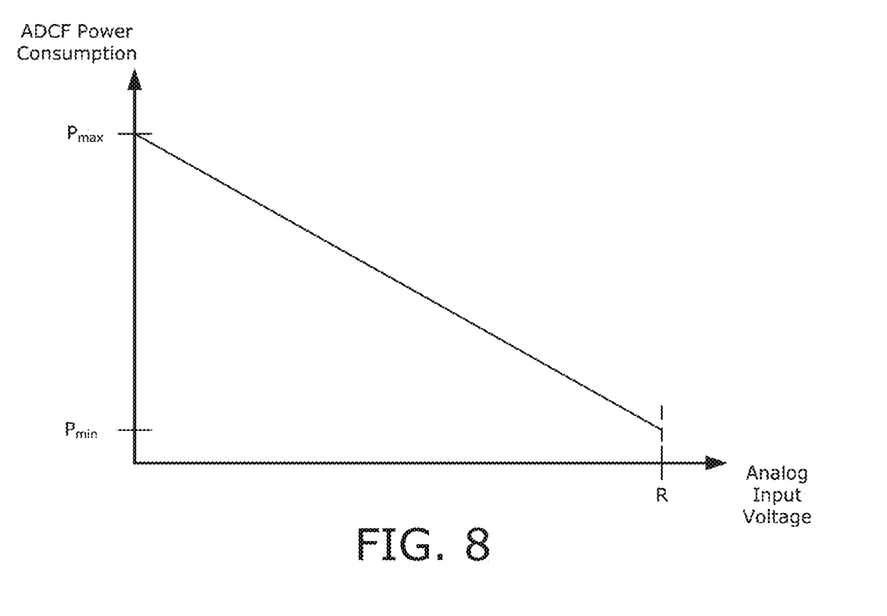
FIG. 8 illustrates an exemplary relationship between power consumption and input analog voltage level in a summing down method according to various aspects of the present disclosure.

According to this method, because step S705 is performed for each 0 in the binary sequence generated by the sigma-delta modulator but not for any 1 in the sequence, the number of subtractions required to compute $y_n$ (and thus the power consumption) decreases as the analog input value increases. FIG. 8 illustrates the relationship between the power consumption and the analog voltage level in a hardware ADCF implementation of this method. As illustrated in FIG. 8, when the input voltage is at its lowest level 0, the power consumption is at the maximum value $P_{max}$. When the input voltage is at its highest level R, the power consumption is at the minimum value $P_{min}$. For input voltages between 0 and R, the binary sequence $x_n$ is composed of both 0s and 1s where the proportion of 1s corresponds to the input voltage. Thus, as the input voltage level increases, the power consumption decreases as a result of the reduced number of subtractions necessary to perform the summing down method.

[Hybrid Summing]

Figure 9:
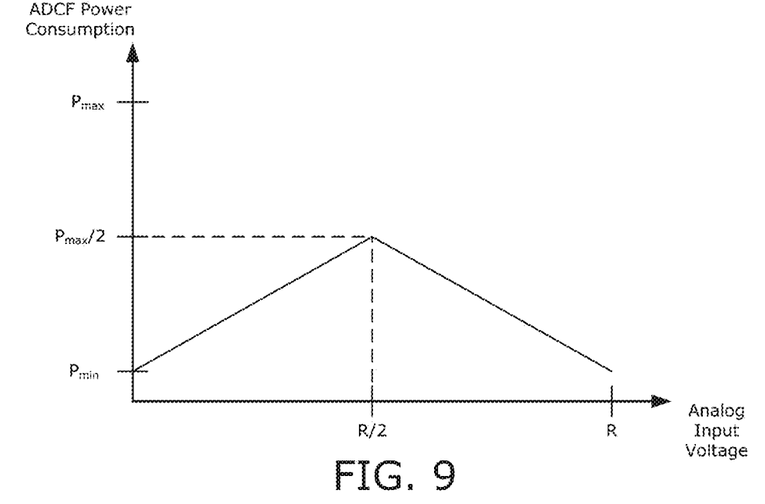
FIG. 9 illustrates an exemplary process flow for a hybrid summing up/down method according to various aspects of the present disclosure.

As can be seen from FIGS. 6 and 8, the summing up and summing down methods are comparatively power efficient in different input voltage ranges. For a lower input voltage value (below R/2), the proportion of 1s in a binary sequence from a sigma-delta modulator is small, and hence the power consumption can be reduced by using the summing up method compared to the summing down method. In contrast, for a higher input voltage value (above R/2), the proportion of 0s in the binary sequence is small, and hence the power consumption is reduced by using the summing down method instead. FIG. 9 illustrates the relationship between the power consumption and the analog voltage level in a hardware ADCF implementation of a hybrid method where both summing up and summing down are performed in a selective fashion. For input values lower than R/2, the summing up method is used. For input values higher than R/2, the summing down method is used. For input values equal to R/2, both methods perform similarly and thus either may be used.

In order to achieve the power consumption relationship illustrated in FIG. 9, it is necessary to decide whether, given a particular input signal, summing up or summing down should be performed. It is possible to include an analog comparator to compare the input signal value with a threshold of R/2 volts and use the output thereof to determine if summing up or down should be performed; however, this approach requires a stable reference voltage in addition to the extra analog comparator circuit. Thus, it is preferable to perform the determination without these extra components.

In the case of an ADCF that computes one multi-bit output sample value from L binary samples of $x_n$, in an implementation where the input analog voltage stays the same for each conversion (as is the case with an image sensor implementation), the statistical properties of the bit sequence output from a sigma-delta modulator remains in a stable condition. Specifically, the proportions of 1s in a long and short bit sequence are approximately the same. Therefore, for the purposes of computing an output value in the ADCF using L input bits from the sigma-delta modulator, it is possible to use a predictor based on the first K bits of the L-bit cycle to make a decision between summing up or summing down. Preferably, K is chosen so that K is an odd integer and K<<L. The predictor then decides if summing up or summing down should be performed based on a majority rule in the K observed bits.

Figure 10:
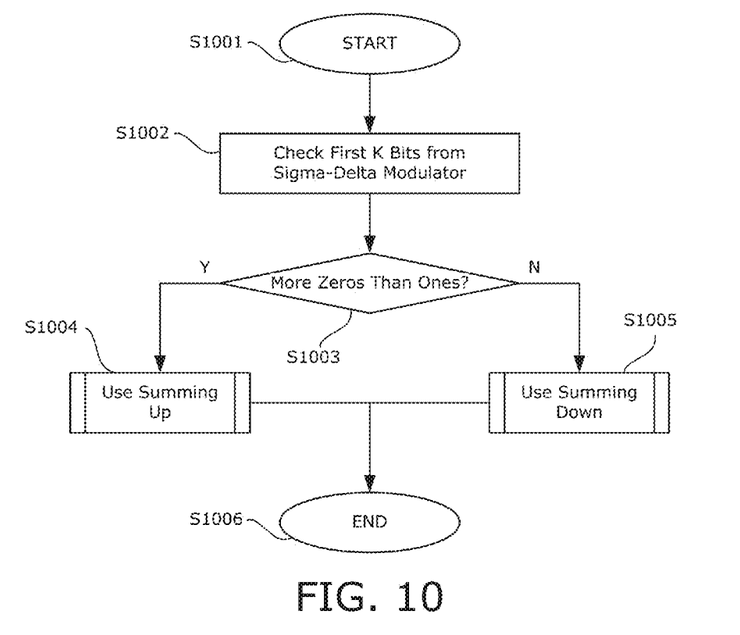
FIG. 10 illustrates an exemplary relationship between power consumption and input analog voltage level in a hybrid summing up/down method according to various aspects of the present disclosure.

FIG. 10 illustrates an exemplary process flow for generating an output value using this hybrid method in an ADCF. The hybrid method begins at step S1001, and proceeds to step S1002 where the first K bits (K odd, K<<L) are checked. At step S1003, a determination is made as to whether there are more 0s than 1s. If, among the K bits, there are more 0s than 1s, the method proceeds to step S1004 and performs summing up. If, however, there are more 1s than 0s, the method instead proceeds to step S1005 and performs summing down. Because K is odd, the majority-rule determination will always succeed in providing a decision and will never result in an equal number of 0s and 1s. Additionally, because K is a small number, the buffer required to store the bits before performing the determination is also small. In one aspect of the present disclosure, the summing up method is the method illustrated in FIG. 5 and the summing down method is the method illustrated in FIG. 7. However, other summing up and summing down methods may also be used, as will be described in more detail below.

The particular value of K is preferably determined in advance. This value may be determined by analyzing statistics from a sigma-delta modulator for different values of K. To test this, a constant voltage value U (0<U<R) is fed to a sigma-delta modulator to generate a stream of binary output bits corresponding to U. Then, K consecutive bits of the output are examined to determine the likelihood that a majority-rule determination using the K bits will correctly predict if U is larger than R/2 or not. For testing purposes, the checking process is performed on a sliding window basis; that is, using a window of length K and sliding said window along the output bits one at a time, and at each position determining if the majority-rule determination is correct. This removes the dependency on the initial condition of the sigma-delta modulator. If a decision error were to occur, it is most likely to occur where U is between 0.25 R and 0.75 R, as these cases have a comparable number of 0s and 1s. Table 1 below shows the percentage of correct decisions for several cases of K and values of U.

TABLE 1

Percentage of Correct Predictions using Majority-Rule of K Bits

| Percentage of Correct Predictions | | K | | |
|---|---|---|---|---|
| | | 3 | 5 | 7 |
| Input Level U | 0.3R | 92.3 | 100 | 100 |
| | 0.4R | 76.6 | 93.2 | 100 |
| | 0.5R | 100 | 100 | 100 |
| | 0.6R | 76.6 | 93.2 | 100 |
| | 0.7R | 92.3 | 100 | 100 |

Table 1 shows that the result is symmetric with respect to U=0.5 R. Moreover, in the case of U=0.5 R the sigma-delta modulator generates an alternating sequence of is and 0s (i.e. 0 1 0 1 and so on), which means that the majority-rule decision will always be correct. In view of these results, K=5 is preferred so as to balance performance with the complexity of implementation.

[Modifications]

In the above implementation, as illustrated in FIG. 9, power consumption can be reduced by approximately 50% since $P_{min}$ is small in practical implementations. Power consumption can further be reduced by using a higher order predictor. Additionally, as illustrated in FIGS. 5 and 7, the particular summing up and summing down implementations used perform addition or subtraction one impulse response coefficient at a time. Further reductions in power consumption can be achieved when longer binary input sequences are considered at once. This effect is multiplied when multiple ADCs are used synchronously, for example in an image sensor.

Figure 11:
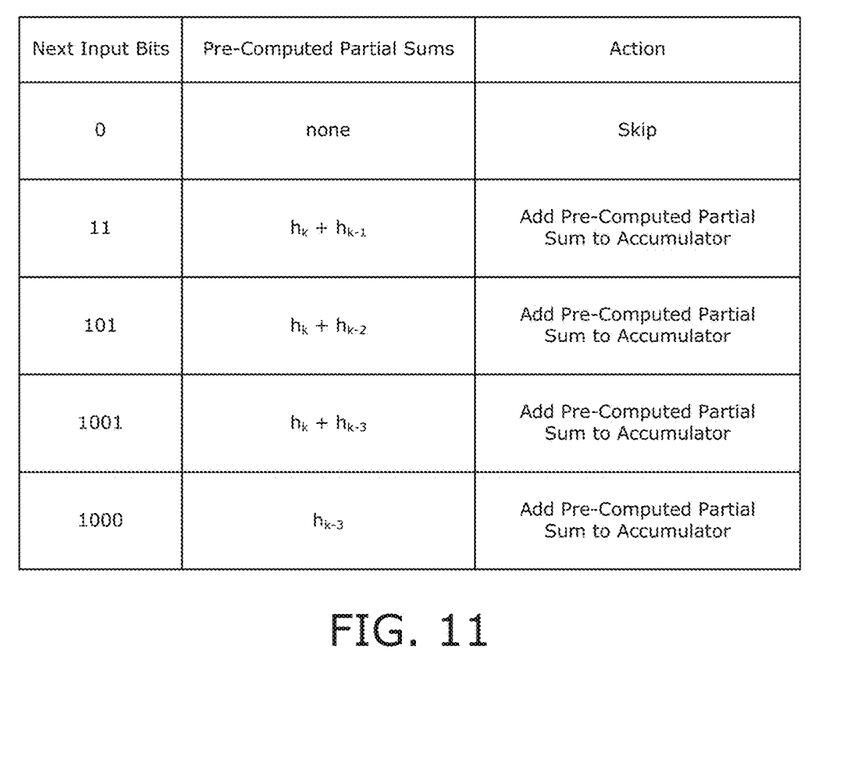
FIG. 11 illustrates exemplary bit patterns for a predictor according to various aspects of the present disclosure.

FIG. 11 illustrates one such implementation where impulse response coefficient strings of length greater than one are analyzed at one time. This may correspond to a summing up method with multiple ADCs, where a bit pattern (rather than a single bit) is considered before each summation step. The pre-computed partial sums illustrated in FIG. 11 are coefficient index k from 0 to L−1. That is, $h_k$ is treated as equal to 0 for any k<0 or k>L−1. The computation and storage of the partial sums to be used in practical implementations may be one of several possible procedures.

In a first example, all of the required partial sums may be pre-computed and stored for all k. This example requires additional memory (3L extra terms) to store all of the pre-computed sums as compared to storing only the impulse response coefficients themselves. In an image sensor where many ADCs share the same pre-computed sums, the additional memory may be only a minor factor because only one copy of each sum will need to be stored for all ADCs.

Figure 12:
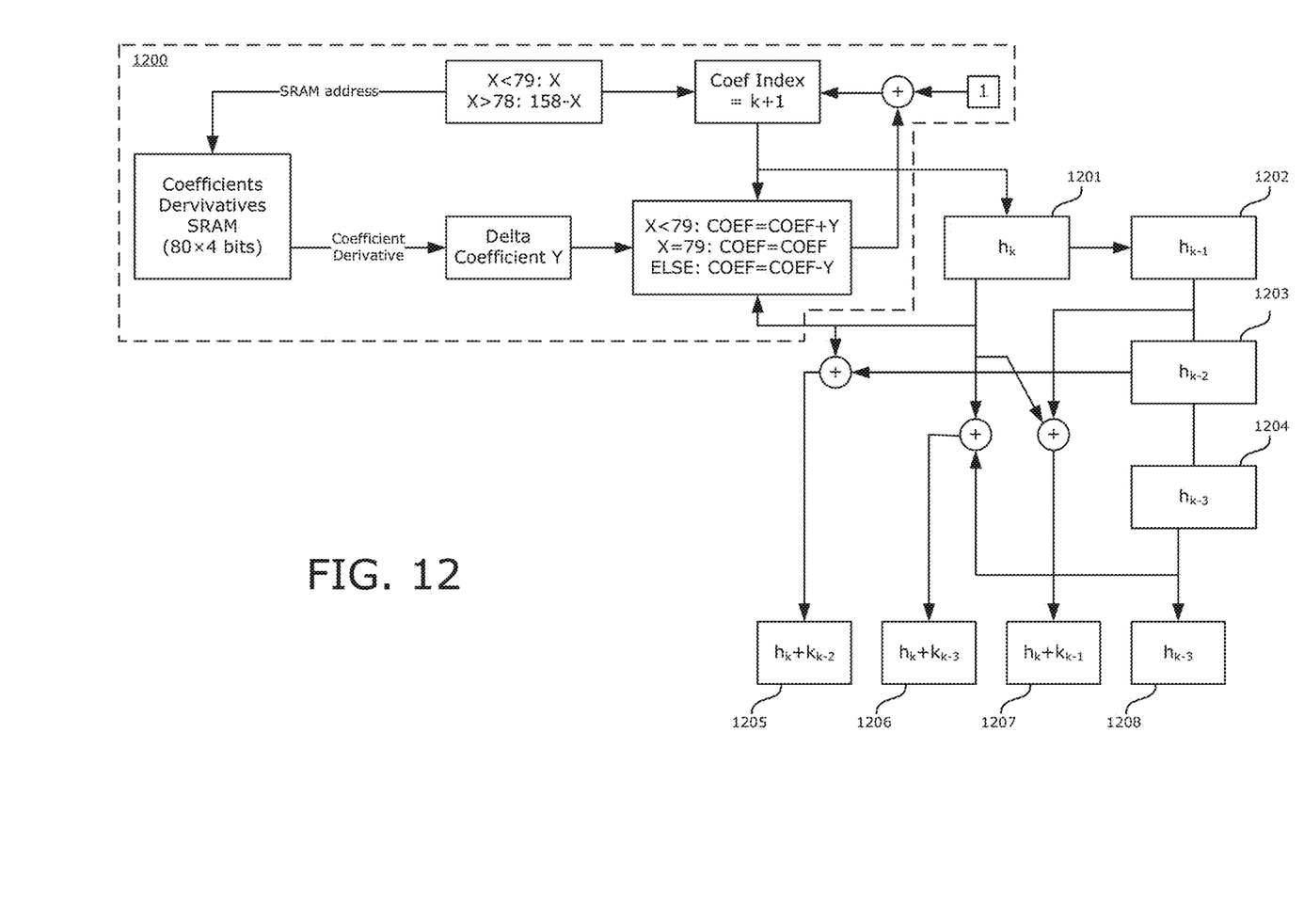
FIG. 12 illustrates an exemplary circuit for calculating partial sums according to the bit patterns of FIG. 11.

In a second example, the partial sums can be pre-computed for each k as they are needed when the incoming bits arrive. In this case, the additional memory is not needed, but the partial sums will need to be computed more than once. FIG. 12 illustrates a circuit that implements the partial sum calculation for the set of bit patterns illustrated in FIG. 11. For purposes of memory efficiency, the filter impulse response coefficients are preferably stored in a differential fashion in memory; i.e., $d_k = h_k - h_{k-1}$ is stored for each k. For instance, the computation of $h_k + h_{k+2}$ for k=2 may be treated as $h_2 + h_0 = 2h_0 + d_1 + d_2$, where the multiplication by 2 is done by left bit shift. The calculations of the filter coefficients $h_k$ from the differential code is done by the differential decoder 1200 in FIG. 12. After differential decoding, the filter coefficient $h_k$ is stored in flip flop 1201. The value is delayed and sequentially stored in a bank of flip flops 1202-1204 to provide the values $h_{k-1}$, $h_{k-2}$, and $h_{k-3}$. Then the filter coefficients are fed to the adders to calculate the partial sums and the results are stored in flip flops 1205-1208 to be used by the ADCF. Beginning from k=0 onward, all of the partial sums may be calculated in a similar manner. Because the partial sums are shared by all ADCs, the power consumption related to computing the partial sums may be insignificant on a per-ADC basis.

To perform analog-to-digital conversion, a decision on using the summing up or the summing down method using the initial K bits is performed in a manner similar to that described above with regard to FIG. 10. To accommodate longer binary input sequences, modified summing up/down methods may be used.

Figure 13:
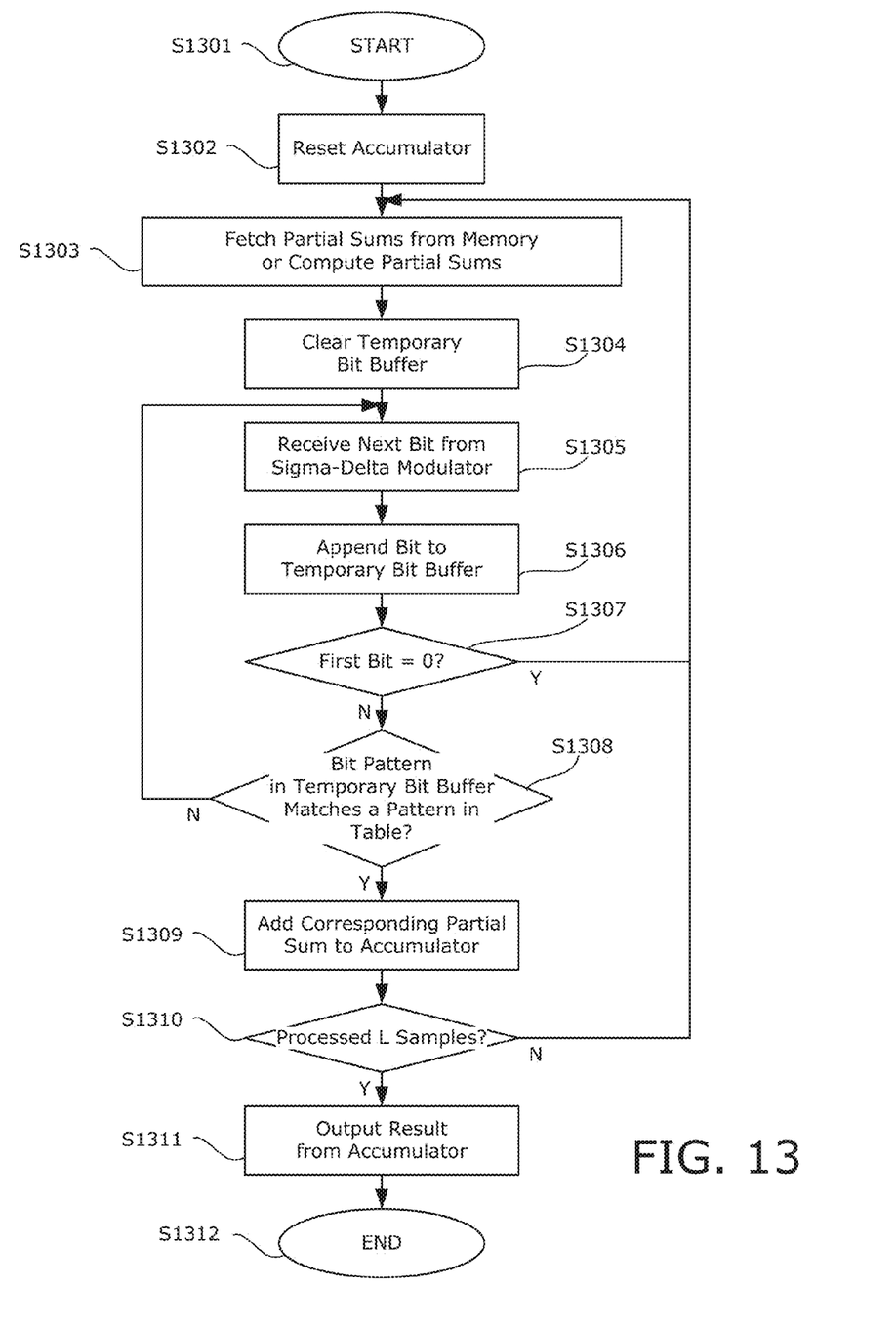
FIG. 13 illustrates an exemplary process flow for a modified summing up method according to various aspects of the present disclosure.

FIG. 13 illustrates an exemplary process flow for a modified summing up method. The method begins at step S1301, and proceeds to step S1302 where the accumulator that holds the convolution sum is reset to 0. At step S1303, pre-computed partial sums (such as those illustrated in FIG. 11) are either computed or fetched from memory. Next, at step S1304, the temporary bit buffer is cleared. The temporary bit buffer is provided to store the incoming bits that have not yet been factored into the convolution sum in the accumulator. Once the temporary bit buffer has been cleared, at step S1305 the next bit is received from the sigma-delta modulator, and then appended to the temporary bit buffer at step S1306. At step S1307, the first bit is examined.

If the first bit (the "oldest" bit) is zero, the first case from FIG. 11 is matched. Thus, no action is performed on the sum in the accumulator, and the process returns to step S1303. If the first bit is 1, the process moves to step S1308 where the bit pattern in the temporary bit buffer is checked against the other cases from FIG. 11. If the pattern does not match any pattern illustrated in FIG. 11, the process returns to step S1305 and receives another bit from the sigma-delta modulator. If, on the other hand, the pattern does match a pattern illustrated in FIG. 11, the partial sum corresponding to the matched pattern is added to the convolution sum in the accumulator at step S1309. Therefore, the step of adding is accomplished using only one addition operation instead of two addition operations, resulting in reduced power consumption. After the pre-computed partial sum has been added, it is determined at step S1310 whether all L samples have been processed. If not, the process returns to step S1303. If all L samples have been processed, the convolution sum is output from the accumulator at step S1311 and the process terminates at step S1312.

By performing this summing up operation on bit strings, power consumption is reduced. To illustrate this, an example where the analog input voltage is R/2 may be analyzed. In this case, the bit stream from a sigma-delta modulator is an alternating sequence 0 1 0 1 0 1 0 1 . . . . When using the approach of FIG. 13, only one sum based on the bit pattern "1 0 1" will need to be computed for every 4 input bits. Hence, the power consumption when the input is R/2 is approximately 25% of the peak power $P_{max}$ discussed above, because $P_{min}$ is small.

While FIGS. 11 and 13 illustrate a case of a modified summing method that considers strings of bits having partial sums containing at most two 1s per string (e.g. 11, 101, 1001), the present disclosure may be extended to cases where strings of bits having partial sums containing three or more 1s are utilized. Such an extension can further improve the power consumption, and at the same time will use more hardware to calculate and store the higher order partial sums. The particular string methodology is preferably chosen based on a given set of target performances for a particular implementation. Additionally, while FIGS. 11 and 13 illustrate the higher order prediction method for the summing up case only, an equivalent procedure for the summing down case is preferably performed in an analogous manner with appropriate modifications to the bit patterns of FIG. 11 and the process steps of FIG. 13, similar to the relationship between FIGS. 5 and 7.

Figure 14:
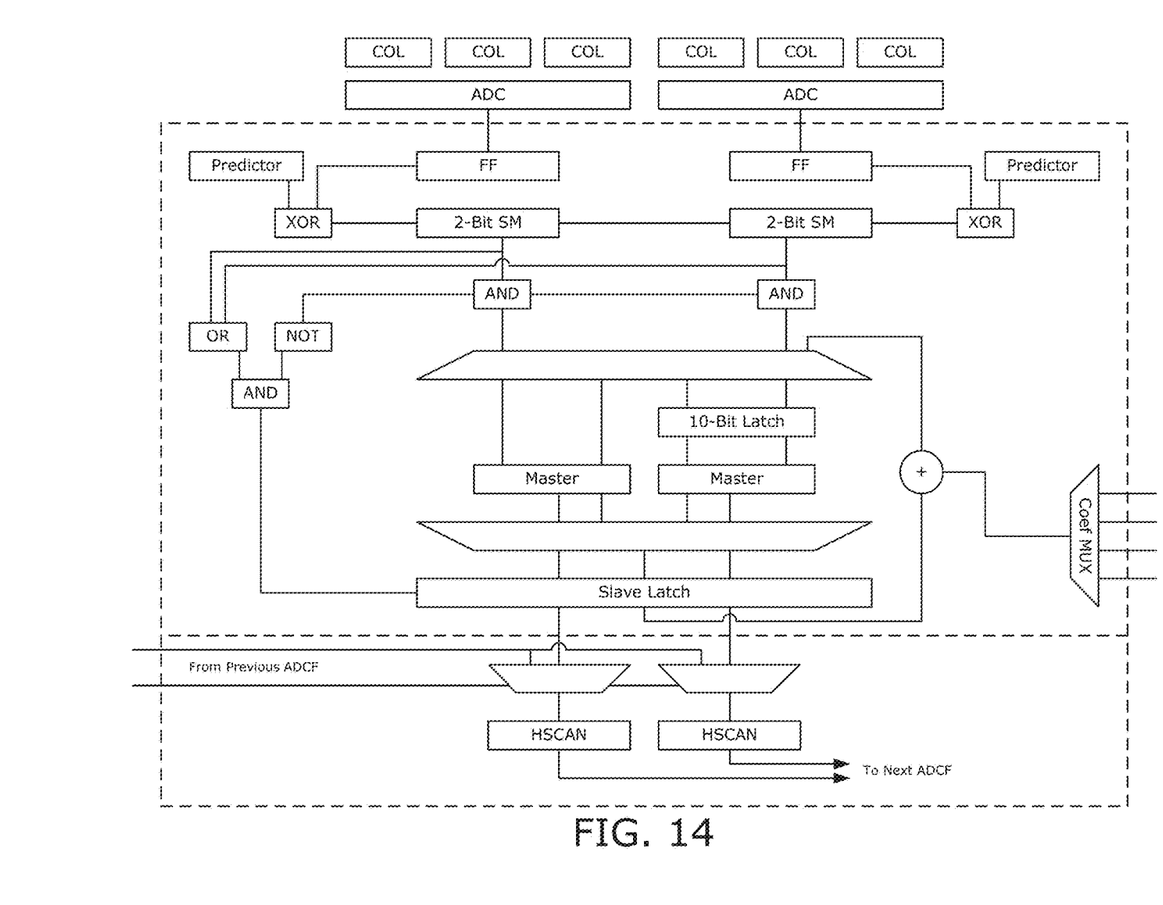
FIG. 14 illustrates an exemplary circuit implementing a modified hybrid summing up/down method according to various aspects of the present disclosure.

FIG. 14 illustrates a circuit that incorporates the modified summing up and summing down methods described above. In this embodiment, the binary sequence from the sampled sigma-delta modulator is shifted to a small shift register that is used in the prediction, and also enables the summation for the convolution sum to be performed once every three or four sigma-delta modulator clocks. The same clock is used for all the logic including accumulations and sampling.

While the power consumption analysis above focuses on the number of addition or subtraction operations in the accumulator, power consumption is also impacted by other components. For example, in the case of an analog input voltage equal to R/2, the adder operation is performed only once in four clock cycles, and hence the memory is updated only once every four clock cycles. Thus, the clock frequency for other components such as the adder, memory, latches, and the like can be lowered. This lowering of clock frequency also contributes to reduced power consumption.

[Conclusion]

With regard to the processes, systems, methods, heuristics, etc. described herein, it should be understood that, although the steps of such processes, etc. have been described as occurring according to a certain ordered sequence, such processes could be practiced with the described steps performed in an order other than the order described herein. It further should be understood that certain steps could be performed simultaneously, that other steps could be added, or that certain steps described herein could be omitted. In other words, the descriptions of processes herein are provided for the purpose of illustrating certain embodiments, and should in no way be construed so as to limit the claims.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary is made herein. In particular, use of the singular articles such as "a," "the," "said," etc. should be read to recite one or more of the indicated elements unless a claim recites an explicit limitation to the contrary.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A sigma-delta analog-to-digital converter, comprising:
a sigma-delta modulator; and
an ADC filter configured to receive a segment of L binary samples from the sigma-delta modulator, L being a positive integer, including:
   a predictor circuit configured to determine whether a power consumption of a first summing method would be higher than a power consumption of a second summing method, based on a content of the segment, and
   an accumulator circuit configured to calculate an output using the first summing method in a case where the power consumption of the first summing method would be lower than the power consumption of the second summing method, and using the second summing method in a case where the power consumption of the first summing method would be higher than the power consumption of the second summing method.

2. The sigma-delta analog-to-digital converter according to claim 1, wherein the first summing method is a summing up method, and the second summing method is a summing down method.

3. The sigma-delta analog-to-digital converter according to claim 2, wherein the predictor circuit is configured to analyze a set of K bits of the segment of L binary samples, K being a positive integer much smaller than L.

4. The sigma-delta analog-to-digital converter according to claim 3, wherein the predictor circuit is configured to determine that the power consumption of the first summing method would be higher than the power consumption of the second summing method if the set of K bits contains more 1s than 0s, and to determine that the power consumption of the first summing method would be lower than the power consumption of the second summing method if the set of K bits contains more 0s than 1s.

5. The sigma-delta analog-to-digital converter according to claim 3, wherein K=5.

6. The sigma-delta analog-to-digital converter according to claim 2, wherein the accumulator circuit is configured, in a case of using the first summing method, to receive a sequence of bits from the segment of L binary samples into a temporary bit buffer, match the sequence to one of a plurality of predetermined reference sequences, and add a corresponding one of a plurality of pre-computed partial sums to a running total in the accumulator circuit.

7. The sigma-delta analog-to-digital converter according to claim 2, wherein the accumulator circuit is configured, in a case of using the second summing method, to receive a sequence of bits from the segment of L binary samples into a temporary bit buffer, match the sequence to one of a plurality of predetermined reference sequences, and subtract a corresponding one of a plurality of pre-computed partial sums to a running total in the accumulator circuit.

8. The sigma-delta analog-to-digital converter according to claim 1, wherein the accumulator circuit is configured to output a running total when all L binary samples have been analyzed.

9. A method of calculating an output in a sigma-delta analog-to-digital converter, comprising:
receiving, at an ADC filter of the sigma-delta analog-to-digital converter, a segment of L binary samples from a sigma-delta modulator of the sigma-delta analog-to-digital converter;
predicting, at a predictor circuit of the ADC filter, whether a power consumption of a first summing method would be higher than a power consumption of a second summing method, based on a content of the segment;
calculating the output using the first summing method in an accumulator circuit of the ADC filter, in a case where the power consumption of the first summing method would be lower than a power consumption of the second summing method; and
calculating the output using the second summing method in an accumulator circuit of the ADC filter, in a case where the power consumption of the first summing method would be higher than a power consumption of the second summing method.

10. The method according to claim 9, wherein the first summing method is a summing up method, and the second summing method is a summing down method.

11. The method according to claim 10, wherein the predicting includes analyzing a set of K bits of the segment of L binary samples, K being a positive integer much smaller than L.

12. The method according to claim 11, wherein the predicting includes determining that the power consumption of the first summing method would be higher than the power consumption of the second summing method if the set of K bits contains more 1s than 0s, and determining that the power consumption of the first summing method would be lower than the power consumption of the second summing method if the set of K bits contains more 0s than 1s.

13. The method according to claim 11, wherein K=5.

14. The method according to claim 10, wherein calculating using the first summing method includes receiving a sequence of bits from the segment of L binary samples into a temporary bit buffer, matching the sequence to one of a plurality of predetermined reference sequences, and adding a corresponding one of a plurality of pre-computed partial sums to a running total in the accumulator circuit.

15. The method according to claim 10, wherein calculating using the second summing method includes receiving a sequence of bits from the segment of L binary samples into a temporary bit buffer, matching the sequence to one of a plurality of predetermined reference sequences, and subtracting a corresponding one of a plurality of pre-computed partial sums to a running total in the accumulator circuit.

16. The method according to claim 9, further comprising outputting a running total when all L binary samples have been analyzed.

17. An image sensor, comprising:
a pixel array; and
a sigma-delta analog-to-digital converter, including a sigma-delta modulator and an ADC filter configured to receive a segment of L binary samples from the sigma-delta modulator, L being a positive integer, the ADC filter having:
a predictor circuit configured to determine whether a power consumption of a first summing method would be higher than a power consumption of a second summing method, based on a content of the segment, and
an accumulator circuit configured to calculate an output using the first summing method in a case where the power consumption of the first summing method would be lower than the power consumption of the second summing method, and using the second summing method in a case where the power consumption of the first summing method would be higher than the power consumption of the second summing method.

18. The image sensor according to claim 17, wherein the first summing method is a summing up method, and the second summing method is a summing down method.

19. The image sensor according to claim 18, wherein the predictor circuit is configured to analyze a set of K bits of the segment of L binary samples, K being a positive integer much smaller than L.

20. The image sensor according to claim 18, wherein the accumulator circuit is configured, to receive a sequence of bits from the segment of L binary samples into a temporary bit buffer, match the sequence to one of a plurality of predetermined reference sequences, and add or subtract a corresponding one of a plurality of pre-computed partial sums to a running total in the accumulator circuit.

* * * * *